United States Patent
Kim et al.

(10) Patent No.: US 8,446,018 B2
(45) Date of Patent: May 21, 2013

(54) PACKAGE ON PACKAGE

(75) Inventors: Woo-Jae Kim, Hwaseong-si (KR);
Young-Hoon Ro, Hwaseong-si (KR);
Sung-Woo Park, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 120 days.

(21) Appl. No.: 13/041,819

(22) Filed: Mar. 7, 2011

(65) Prior Publication Data
US 2011/0215471 A1    Sep. 8, 2011

(30) Foreign Application Priority Data
Mar. 8, 2010   (KR) .................. 10-2010-0020389

(51) Int. Cl.
*H01L 23/48*    (2006.01)
*H01L 23/02*    (2006.01)

(52) U.S. Cl.
USPC ........... 257/780; 257/686; 257/688; 257/784; 257/E23.085

(58) Field of Classification Search
USPC ............... 257/686, 780, 784, 688, E23.085
See application file for complete search history.

(56) References Cited

U.S. PATENT DOCUMENTS

| | | | |
|---|---|---|---|
| 5,394,303 A * | 2/1995 | Yamaji ..................... | 361/749 |
| 6,081,026 A * | 6/2000 | Wang et al. ................ | 257/700 |
| 6,869,825 B2 * | 3/2005 | Chiu ......................... | 438/106 |
| 6,998,704 B2 * | 2/2006 | Yamazaki et al. .......... | 257/688 |
| 7,230,328 B2 * | 6/2007 | Hazeyama et al. ......... | 257/685 |
| 7,425,758 B2 | 9/2008 | Corisis et al. | |
| 7,520,781 B2 * | 4/2009 | Clayton et al. ............ | 439/631 |
| 7,642,635 B2 * | 1/2010 | Kikuchi et al. ............ | 257/686 |
| 7,812,440 B2 * | 10/2010 | Yamazaki et al. .......... | 257/701 |
| 7,888,185 B2 * | 2/2011 | Corisis et al. .............. | 438/123 |
| 2004/0021211 A1 * | 2/2004 | Damberg ................... | 257/686 |
| 2004/0238936 A1 * | 12/2004 | Rumer et al. .............. | 257/688 |
| 2005/0012199 A1 * | 1/2005 | Rosenau et al. ........... | 257/696 |

FOREIGN PATENT DOCUMENTS

| | | |
|---|---|---|
| KR | 100520409 | 10/2005 |
| KR | 100744151 B1 | 7/2007 |

* cited by examiner

Primary Examiner — Nitin Parekh
(74) Attorney, Agent, or Firm — Harness, Dickey & Pierce, P.L.C.

(57) ABSTRACT

A package on package structure is provided. The package on package structure may include a first substrate having a first center region and a first C-shaped edge region at a first end of the first center region. In example embodiments, the first C-shaped edge region may form a first space. The package structure may further include at least two first connection pads on an inner surface of the first C-shaped edge region and the at least two first connection pads may be arranged to face one another. In example embodiments, at least one first solder ball may be arranged in the first space and the at least one first solder ball may be connected to the at least two first connection pads.

20 Claims, 6 Drawing Sheets

PACKAGE ON PACKAGE

CROSS-REFERENCE TO RELATED APPLICATIONS

This application claims priority under 35 C. §119 to Korean Patent Application No. 10-2010-0020389, filed on Mar. 8, 2010 in the Korean Intellectual Property Office (KIPO), the entire contents of which are herein incorporated by reference.

BACKGROUND

1. Field

Example embodiments relate to a package on package structure, and more particularly to a package on package (POP) structure that may be made by vertically laminating one or more semiconductor packages.

2. Description of the Related Art

Semiconductor packages have been developed in the direction of satisfying demands for multifunction, high capacity, and miniaturization. For this, a system in package (SIP), in which several semiconductor packages are integrated into one semiconductor package to achieve the high capacity and multifunction and to greatly reduce the size of the semiconductor package, has been proposed.

The SIP has progressed briefly from two sides. One is a multi-chip package (MCP) in which several semiconductor chips are formed to be laminated inside one semiconductor package, and the other is the package on package (POP) in which semiconductor packages, which are separately assembled and of which an electric inspection has been completed, are formed to be vertically laminated.

Hereinafter, with reference to FIGS. 1 to 3, a package on package (POP) structure in the related art will be briefly described. FIGS. 1 and 2 are sectional views illustrating an upper semiconductor package and a lower semiconductor package in the related art, and FIG. 3 is a sectional view illustrating a structure in which packages as illustrated in FIGS. 1 and 2 are laminated.

Referring to FIG. 1, an upper semiconductor package 100 includes a substrate 102, a semiconductor chip 104, an encapsulant 108, and solder balls 110.

The semiconductor chip 104 is attached to an upper surface 112 of the substrate 102, and is electrically connected to wire bonding pads (not illustrated) of the substrate 102 by wires 106.

The encapsulant 108 is formed on the whole upper surface 112 of the substrate 102 to cover the semiconductor chip 104 and the wires 106.

The solder balls 110 are attached to a lower surface 114 of the substrate 102, and are electrically connected to the semiconductor chip 104 through a printed circuit pattern (not illustrated) formed in the substrate 102.

Referring to FIG. 2, a lower semiconductor chip 200 includes a substrate 202, a semiconductor chip 204, an encapsulant 208, and solder balls 210, and further includes a plurality of connection pads 216.

The semiconductor chip 204 is attached to an upper surface 212 of the substrate 202, and is electrically connected to wire bonding pads (not illustrated) of the substrate 202 by wires 206.

The encapsulant 208 is formed on a portion of the upper surface 212 of the substrate 202 to cover the semiconductor chip 204 and the wires 206. Specifically, the encapsulant 208 is not formed on the upper surface 212 of the substrate 102, on which the connection pads 216 are arranged, to expose the connection pads 216.

The solder balls 210 are attached to a lower surface 214 of the substrate 202, and are electrically connected to the semiconductor chip 204 through a printed circuit pattern (not illustrated) &Lined in the substrate 202.

The connection pads 216 are to connect the solder balls 110 of the upper semiconductor package 100 to the lower semiconductor package 200, and are arranged on the upper surface of the substrate 202 to correspond to the solder balls 110 of the upper semiconductor package 100, respectively.

Referring to FIG. 3, the upper semiconductor package 100 is arranged on the upper portion of the lower semiconductor package 200, and the solder balls 110 of the upper semiconductor package 100 are connected to the corresponding connection pads 216, so that the package on package (POP) structure, in which the lower semiconductor package 200 and the upper semiconductor package 100 are laminated, is formed.

However, due to the recent trend of multifunction and high capacity, the number of input/output (I/O) pins of the semiconductor package is increased to cause the pitch and the size of the solder balls to be gradually decreased, whereas the thickness of the semiconductor package is gradually increased as two or more semiconductor chips are packaged in one semiconductor package. Accordingly, it becomes difficult to vertically laminate the semiconductor packages in the above-described manner.

In other words, in the POP structure as described above with reference to FIGS. 1 to 3, if the thickness of the lower semiconductor package 200, and particularly, the thickness of a region where the semiconductor chip 204 is packaged, is increased, the pitch and the size of the solder balls 110 of the upper semiconductor package 100 should also be increased as much as the increment of the thickness in order for the solder balls 110 of the upper semiconductor package 100 to be connected to the connection pads 216 of the lower semiconductor package 200. However, since the pitch and the size of the solder balls 110 are on a decreasing trend as described above, the above-described POP structure cannot be implemented.

SUMMARY

Accordingly, example embodiments have been made to solve the above-mentioned problems occurring in the related art, and one object to be solved by example embodiments is to provide a package on package (POP) structure that makes it possible to laminate semiconductor packages even if the thickness of the semiconductor package is increased and the pitch and the size of the solder balls are decreased.

In accordance with example embodiments, a package structure may include a first substrate having a first center region and a first C-shaped edge region at a first end of the first center region. In example embodiments, the first C-shaped edge region may form a first space. The package structure may further include at least two first connection pads on an inner surface of the first C-shaped edge region and the at least two first connection pads may be arranged to face one another. In example embodiments, at least one first solder ball may be arranged in the first space and the at least one first solder ball may be connected to the at least two first connection pads.

Additional advantages, subjects, and features of example embodiments will be set forth in part in the description which follows and in part will become apparent to those having ordinary skill in the art upon examination of the following or may be learned from practice of example embodiments.

In accordance with example embodiments, a package on package may have a package on package structure in which a second package is laminated on an upper portion of a first package, wherein the first package includes a first substrate having edge regions which are bent toward an upper surface of the first substrate, respectively, so that the upper surface of the first substrate in each of the edge regions forms facing portions with a predetermined space interposed between the facing portions; a first semiconductor chip attached to the upper surface of the first substrate except for the facing portions; an encapsulant arranged on the upper surface of the first substrate except for the facing portions to seal the first semiconductor chip; and first conductors installed in the space interposed between the facing portions.

BRIEF DESCRIPTION OF THE DRAWINGS

The above and other objects, features and advantages of example embodiments will be more apparent from the following detailed description taken in conjunction with the accompanying drawings, in which.

DETAILED DESCRIPTION OF EXAMPLE EMBODIMENTS

Figure 1:
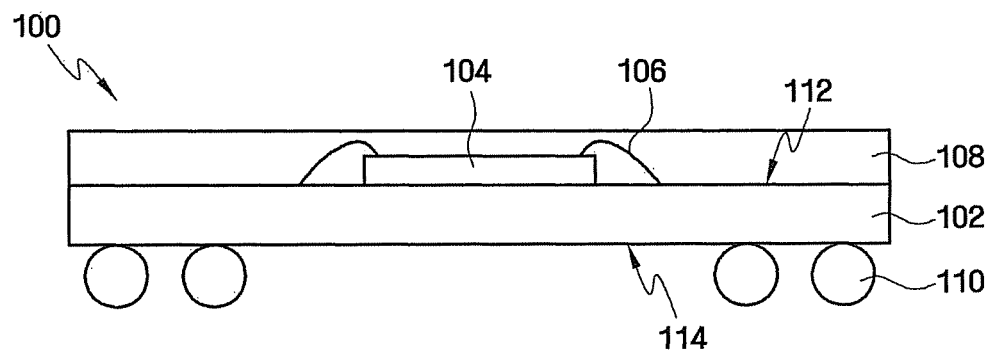
FIGS. 1 and 2 are sectional views of an upper semiconductor package and a lower semiconductor package in the related art
Figure 2:
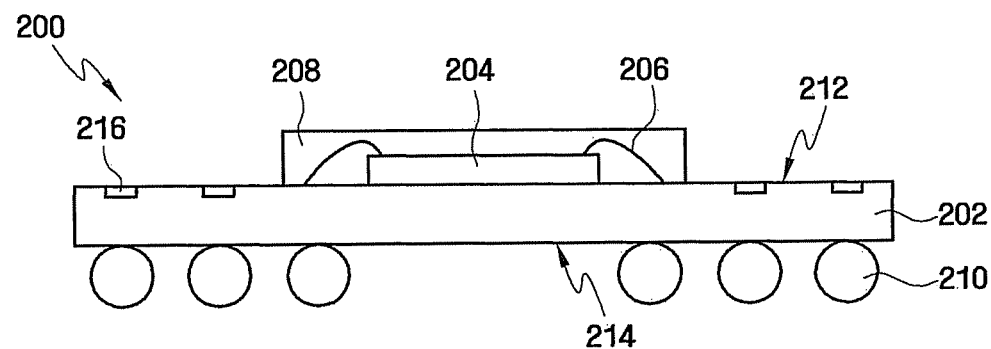
Figure 3:
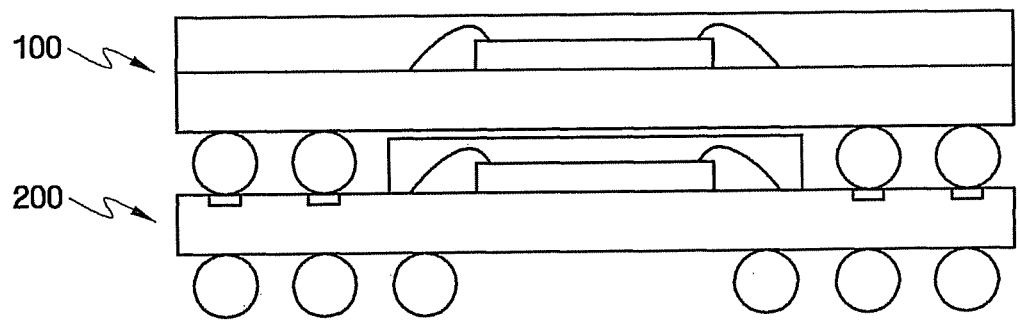
FIG. 3 is a sectional view of a related art structure in which the packages illustrated in FIGS. 1 and 2 are laminated.

Hereinafter, example embodiments will be described in detail with reference to the accompanying drawings. The aspects and features of example embodiments and methods for achieving the aspects and features will be apparent by referring to the embodiments to be described in detail with reference to the accompanying drawings. However, example embodiments are not limited to the embodiments disclosed hereinafter, but can be implemented in diverse forms. The matters defined in the description, such as the detailed construction and elements, are nothing but specific details provided to assist those of ordinary skill in the art in a comprehensive understanding of example embodiments, and example embodiments is only defined within the scope of the appended claims. In the drawings, sizes and relative sizes of layers and areas may be exaggerated for clarity in explanation.

The term "on" that is used to designate that an element is on another element located on a different layer or a layer includes both a case where an element is located directly on another element or a layer and a case where an element is located on another element via another layer or still another element. In contrast, the term "directly on" means that an element is directly on another element or a layer without intervention of any other element or layer. In the entire description of example embodiments, the same drawing reference numerals are used for the same elements across various figures. Also, the term "and/or" includes the respective described items and combinations thereof.

Spatially relative wordings "below", "beneath", "lower", "above", "upper", and so forth, as illustrated in the drawings, may be used to facilitate the description of relationships between an element or constituent elements and another element or other constituent element. The spatially relative wordings should be understood as wordings that include different directions of the element in use or operation in addition to the direction illustrated in the drawings. In the entire description of example embodiments, the same drawing reference numerals are used for the same elements across various figures.

In the following description of example embodiments, example embodiments will be described with reference to plan views and sectional views which are ideal schematic views. The form of exemplary views may be modified due to the manufacturing techniques and/or allowable errors. Accordingly, example embodiments are not limited to their specified form as illustrated, but include changes in form being produced according to manufacturing processes. Accordingly, areas exemplified in the drawings have rough properties, and the shapes of areas in the drawings are to exemplify specified forms of areas of elements, but do not limit the scope of example embodiments.

Figure 4:
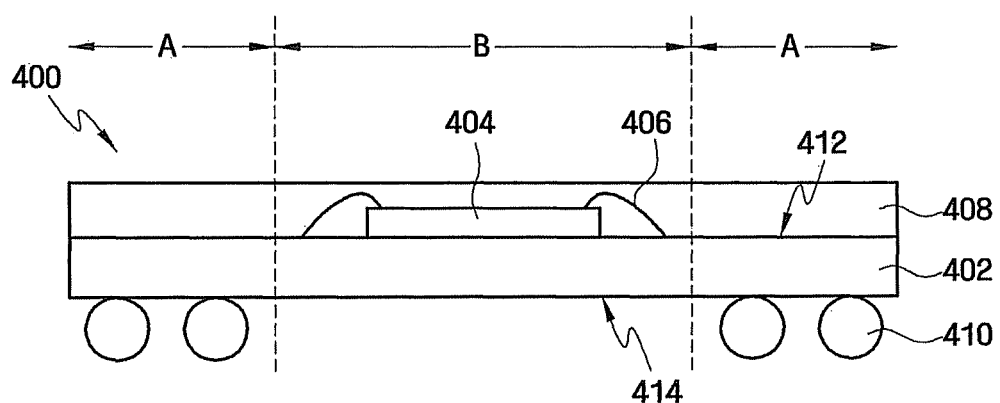
FIGS. 4 and 5 are sectional views of an upper semiconductor package and a lower semiconductor package according to example embodiments.
Figure 5:
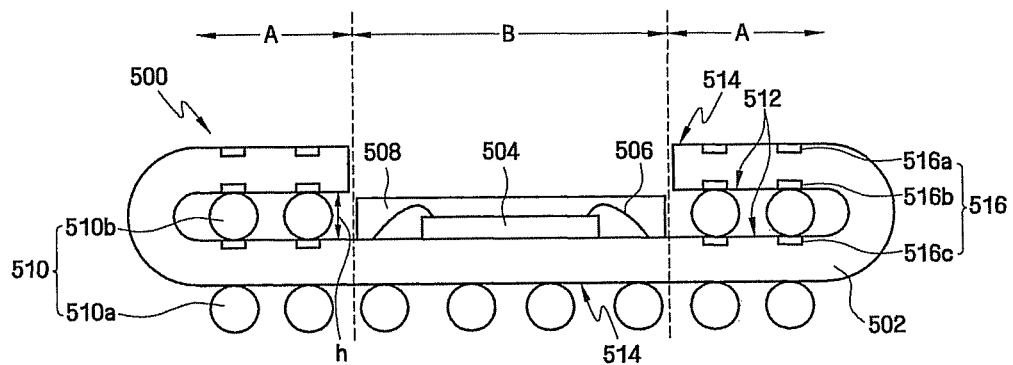
Figure 6:
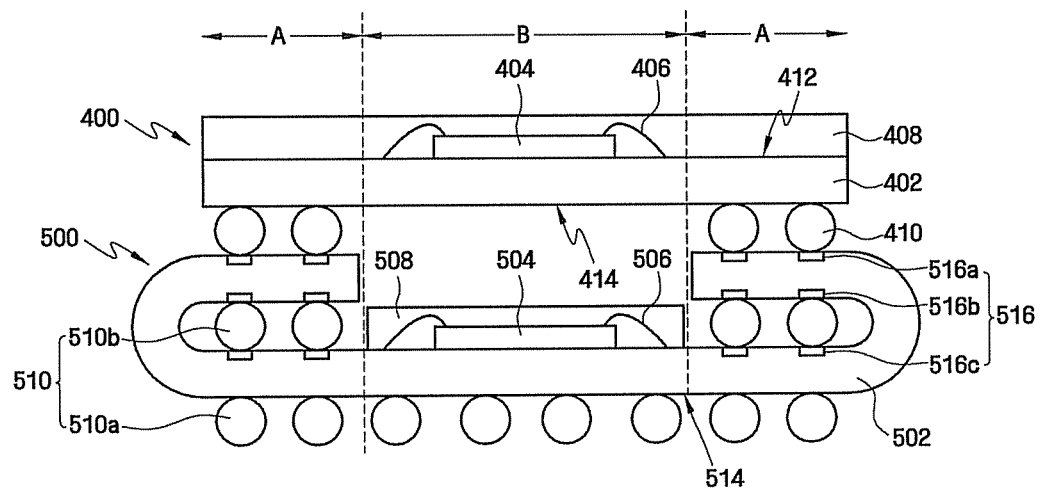
FIG. 6 is a sectional view of a structure in which packages as illustrated in FIGS. 4 and 5 are laminated.

Hereinafter, with reference to FIGS. 4 to 6, a package on package (POP) structure according to example embodiments will be described. FIGS. 4 and 5 are sectional views of an upper semiconductor package and a lower semiconductor package according to example embodiments, and FIG. 6 is a sectional view of a structure in which packages as illustrated in FIGS. 4 and 5 are laminated.

Referring to FIG. 4, an upper semiconductor package 400 may include a substrate 402, a semiconductor chip 404, an encapsulant 408, and solder balls 410.

The semiconductor chip 404 may be attached to an upper surface 412 of the substrate 402 by an adhesive, for example, liquid epoxy or an adhesive tape. In addition, the semiconductor chip 404 may also be electrically connected to wire bonding pads (not illustrated) of the substrate 402 by wires 406. In example embodiments, it is exemplified that one semiconductor chip 404 is included in the upper semiconductor package 400. However, the number of semiconductor chips is not limited thereto, and the upper semiconductor package 400 may further include one or more semiconductor chips (not illustrated) which are vertically laminated on the semiconductor chip 404.

The encapsulant 408 may be faulted on the upper surface 412 of the substrate 402 to cover and seal the semiconductor chip 404 and the wires 406. In example embodiments, it is exemplified that the encapsulant 408 is formed on the whole upper surface 412 of the substrate 402. However, example embodiments are not limited thereto, and the encapsulant 408 may be formed on a portion of the upper surface 412 of the substrate 402 to cover the semiconductor chip 404 and the wires 406.

The solder balls 410 may be attached to a lower surface 414 of the substrate 402, and may be electrically connected to the semiconductor chip 404 through a printed circuit pattern (not illustrated) formed in the substrate 402. The solder balls 410 may connect to a lower semiconductor package 500 (see FIG. 5), and various conductors may be used for the same purpose in place of the solder balls 410.

In the structure of the upper semiconductor package 400, its center region may be used as a region where the semiconductor chip 404 is packaged, and its edge regions may be used as connection regions for connecting to the lower semiconductor package 500. Hereinafter, for convenience in explanation, it is assumed that the upper semiconductor package 400 has a center region B that is a region where the semiconductor chip 404 is packaged and edge regions A arranged around the center region B. The lower semiconductor package 500 may also have the same regions, that is, edge regions A and center region B.

Referring to FIG. 5, the lower semiconductor package 500 may include a substrate 502, a semiconductor chip 504, an encapsulant 508, and solder balls 510, and may further include a plurality of connection pads 516.

The substrate 502 may be made of a flexible material. Edges of the substrate 502 may be bent in a direction of the upper surface 512 so that edge regions A thereof are in the form of a "C-shape" ("⊂" and "⊃"), and a center region B thereof may be in a relatively flat ("—") shape. Accordingly, in the edge regions A, the substrate 502 may form facing portions of the upper surface 512 with a space interposed between the facing portions, and the height h of the space is substantially the same as the height of second solder balls 510b to be described later. As used in this specification, the term "C-shape" may encompass various shapes, for example, a semicircle, a parabolic shape, a J-shape, a U-shape, and/or an open box shape. Thus, example embodiments are not limited to the specific "C-shape" illustrated in the figures.

The semiconductor chip 504 may be attached to an upper surface 512 of the substrate 502 in the center region B, and may be electrically connected to wire bonding pads (not illustrated) of the substrate 502 by wires 506. In example embodiments, it is exemplified that one semiconductor package 504 is included in the lower semiconductor package 500. However, example embodiments are not limited thereto, and the lower semiconductor package 500 may further include one or more semiconductor chips (not illustrated) which are vertically laminated on the semiconductor chip 504.

The encapsulant 508 may be formed on a portion of the upper surface 512 of the substrate 502 to cover the semiconductor chip 504 and the wires 506. Specifically, the encapsulant 508 may be formed on the whole or a portion of the upper surface 512 of the substrate 502 of the center region B to cover the semiconductor chip 504 and the wires 506, but is not formed on the substrate 502 of the edge regions A. The encapsulant 508 may be made of thermosetting resin, for example, an epoxy mold compound (EMC).

The solder balls 510 may include first solder balls 510a attached to a lower surface 514 of the substrate 502 and second solder balls 510b attached to the upper surface 512 of the substrate 502.

In example embodiments, the first solder balls 510a may be attached to the lower surface 514 of the substrate 502 and may be electrically connected to the semiconductor chip 504 through the print circuit pattern (not illustrated) in the substrate 502. The first solder balls 510a may be electrically connected to a mother board (not illustrated) or another semiconductor package (not illustrated) arranged on the lower portion of the lower semiconductor package 500. In addition to the first solder balls 510a, according to example embodiments, several conductors may be used for the same purpose in place of the first solder balls 510a.

The second solder balls 510b may be interposed in the space between the facing portions of the upper surface 512 of the substrate 502 in the edge regions A. The second solder balls 510b may be electrically connected to the upper semiconductor package 400, and may be arranged to correspond to the solder balls 410 of the upper semiconductor package 400. In addition to the second solder balls 510b according to example embodiments, various conductors may be used for the same purpose in place of the second solder balls 510b.

The connection pads 516 may connect the solder balls 410 of the upper semiconductor package 400 to the lower semiconductor package 500, and may include first connection pads 516a arranged on the lower surface 514 of the substrate 502 and second and third connection pads 516b and 516c may be arranged on the upper surface 512 of the substrate 502.

More specifically, the first connection pads 516a may be arranged on the lower surface 514 of the substrate 502 that faces the upper semiconductor package 400 in the edge region A so as to correspond to the solder balls 410 of the upper semiconductor package 400. The first connection pads 516a may be directly connected to the solder balls 410 of the upper semiconductor package 400 in the package on package (POP) structure (see FIG. 6) to be described later.

The second and third connection pads 516b and 516c may be arranged on the facing portions of the upper surface 512 of the substrate 502 in the edge regions A so as to correspond to the solder balls 410 of the upper semiconductor package 400. As described above, since the second solder balls 510b may be arranged in the space between the facing portions of the upper surface 512 of the substrate 502 in the edge regions A so as to correspond to the solder balls 410 of the upper semiconductor package 400, the second connection pads 516b may be directly connected to top portions of the second solder balls 510b, and the third connection pads 516c may be directly connected to bottom portions of the second solder balls 510b, respectively.

Referring to FIG. 6, the upper semiconductor package 400 may be arranged on the upper portion of the lower semiconductor package 500, and the solder balls 410 of the upper semiconductor package 400 may be directly connected to the corresponding first connection pads 516a, so that the package on package (POP) structure in which the lower semiconductor package 500 and the upper semiconductor package 400 are laminated may be formed.

In the above-described structure as illustrated in FIGS. 4 to 6, the second solder balls 510b and the portion of the substrate 502 arranged on the upper portions of the second solder balls 510b in the edge regions A serve to increase the thickness of the edge regions A of the lower semiconductor package 500 which are regions where the upper semiconductor package 400 is connected to the lower semiconductor package 500. In example embodiments, even if two or more semiconductor chips are included in the lower semiconductor package 500 to increase the thickness of the center region B or the pitch and the size of the solder balls 410 of the upper semiconductor package 400 are decreased, the height of the second solder balls 510b and the thickness of the substrate 502 arranged on the upper portion of the second solder balls 510b can compensate for such effects of thickness increase of the center region B of the lower semiconductor package 500 and size decrease of the solder balls 410 of the upper semiconductor package 400.

Figure 7:
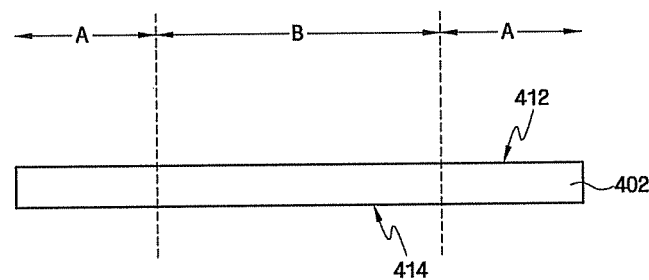
FIGS. 7 and 8 are views explaining intermediate processes for fabricating the upper semiconductor package of FIG. 4.
Figure 8:
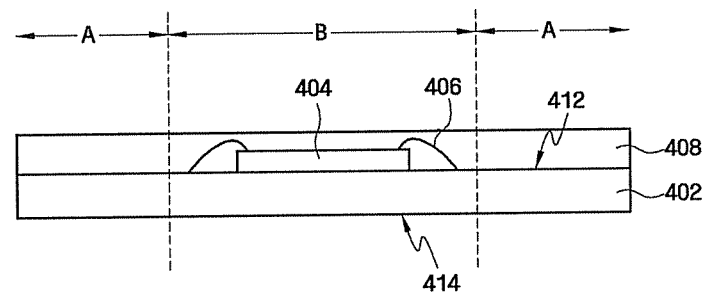

Hereinafter, with reference to FIGS. 4 to 6, and 7 to 12, a method of fabricating a package on package structure according to example embodiments will be described. FIGS. 7 and 8 are views explaining intermediate processes for fabricating the upper semiconductor package of FIG. 4 and FIGS. 9 to 12 are views explaining intermediate processes for fabricating the lower semiconductor package of FIG. 5.

First of all, with reference to FIGS. 4, 7 and 8, a method of fabricating an upper semiconductor package according to example embodiments will be described.

Referring to FIG. 7, a substrate 402 having an upper surface 412 and a lower surface 414 is provided. Although not illustrated in the drawing, a printed circuit pattern may be aimed in the substrate 402, and a plurality of pads required for the connection to the outside may be arranged on the upper surface 412 and the lower surface 414 of the substrate 402. For example, wire bonding pads may be arranged on the upper surface 412 of the substrate 402. The substrate 402 includes a center region B that is a region where a semiconductor chip 404 may be packaged and edge regions A arranged around the center region B.

Referring to FIG. 8, the semiconductor chip 404 may be attached to the upper surface 412 of the substrate 402 in the center region B using an adhesive, for example, a liquid epoxy. In example embodiments, a wire bonding operation may be performed to electrically connect bonding pads (not illustrated) of the semiconductor chip 404 to the wire bonding pads (not illustrated) arranged on the upper surface 412 of the substrate 402. Thus, the semiconductor chip 404 may be connected to the upper surface 412 of the substrate 402 using wires 406.

In example embodiments, an encapsulant 408 for covering the semiconductor chip 404 and the wires 406 may be fowled on the upper surface 412 of the substrate 402 by performing a molding process for sealing the semiconductor chip 404 and the wires 406 on a resultant product of the wire bonding. In the drawing, the encapsulant 408 is formed on the whole upper surface 412 of the substrate 402, however, example embodiments are not limited thereto as the encapsulant 408 may only be formed to cover the semiconductor chip 404 and the wires 406 without covering the whole upper surface 412 of the substrate 402.

Referring to FIG. 4, a process of attaching solder balls 410 to the lower surface 414 of the molded substrate 402 may be performed. In particular, the solder balls 410 may be attached to the lower surface 414 of the substrate 402 in the edge regions A.

Referring to FIGS. 5 and 9 to 12, a method of fabricating a lower semiconductor package will be described.

Figure 9:
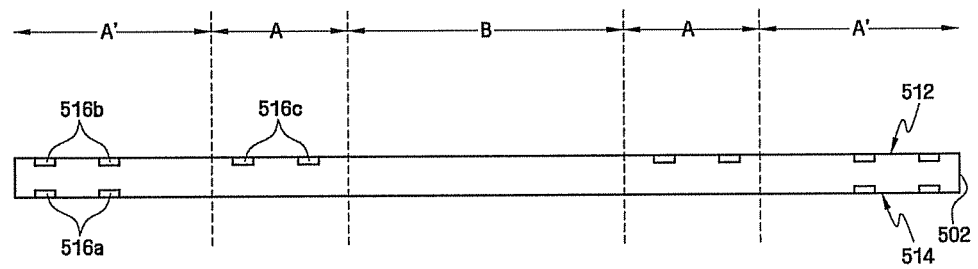
FIGS. 9 to 12 are views explaining intermediate processes for fabricating the lower semiconductor package of FIG. 5.

Referring to FIG. 9, a substrate 502 having an upper surface 512 and a lower surface 514 is provided. Although not illustrated in the drawing, a printed circuit pattern may be formed in the substrate 502, and a plurality of pads, for example, wire bonding pads, required for the connection to the outside may be arranged on the upper surface 512 and the lower surface 514 of the substrate 502.

As described above, the lower semiconductor package 500 may include a center region B where a semiconductor chip 504 may be packaged and edge regions A arranged around the center region B. In example embodiments, the edge regions may be used as connection regions for connecting the lower semiconductor package 500 to the upper semiconductor package 400. In example embodiments, the substrate 502, which is arranged on the center region B and the edge regions A, may be extended up to outer regions A' arranged around the edge regions A.

On the upper surface 512 and the lower surface 514 of the substrate 502, a plurality of connection pads 516 may be arranged. Specifically, on the upper surface 512 of the substrate 502 in the edge regions A, third connection pads 516c may be arranged to correspond to the solder balls 410 of the upper semiconductor package 400. Second connection pads 516b may be arranged on the upper surface 512 of the substrate 502 in the outer regions A', and first connection pads 516a may be arranged on the lower surface 514 in positions that correspond to the second connection pads 516b.

Figure 10:
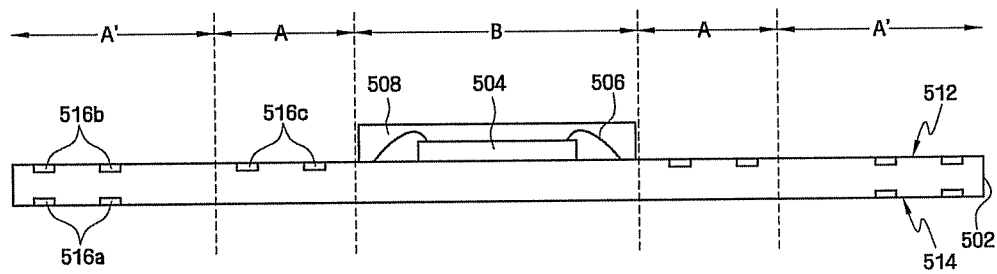

Referring to FIG. 10, the semiconductor chip 504 may be attached to the upper surface 512 of the substrate 502 in the center region B using an adhesive, for example, an epoxy molding compound. In example embodiments, a wire bonding operation for electrically connecting the bonding pads (not illustrated) of the semiconductor chip 504 to the wire bonding pads (not illustrated) arranged on the upper surface 512 of the substrate 502 may be performed. Thus, the semiconductor chip 504 may be connected to the substrate 502 using wires 506.

In example embodiments, an encapsulant 508 for covering the semiconductor chip 504 and the wires 506 may be formed on a portion of the upper surface 512 of the substrate 502 by performing a molding process for sealing the semiconductor chip 504 and the wires 506 on a resultant product of the wire bonding operation. The encapsulant 508 may be formed not to cover the edge regions A and the outer regions A' of the substrate 502.

Figure 11:
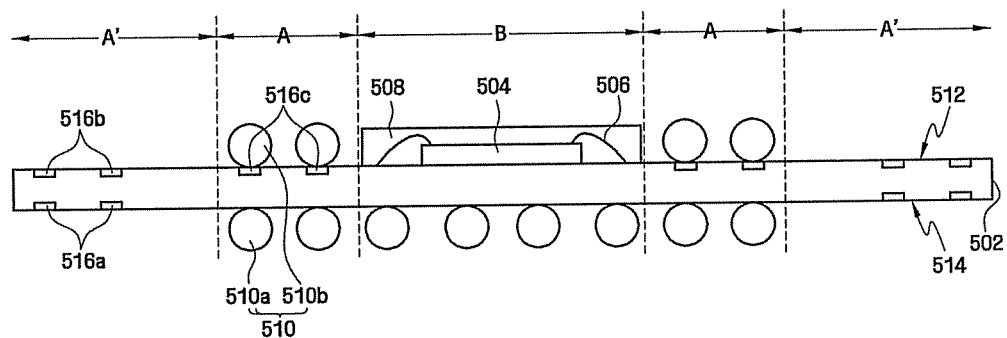

Referring to FIG. 11, the first solder balls 510a may be attached to the lower surface 514 of the molded substrate 502, and second solder balls 510b may be attached to the third connection pads 516c arranged on the upper surface 512 of the substrate 502 in the edge regions A.

Figure 12:
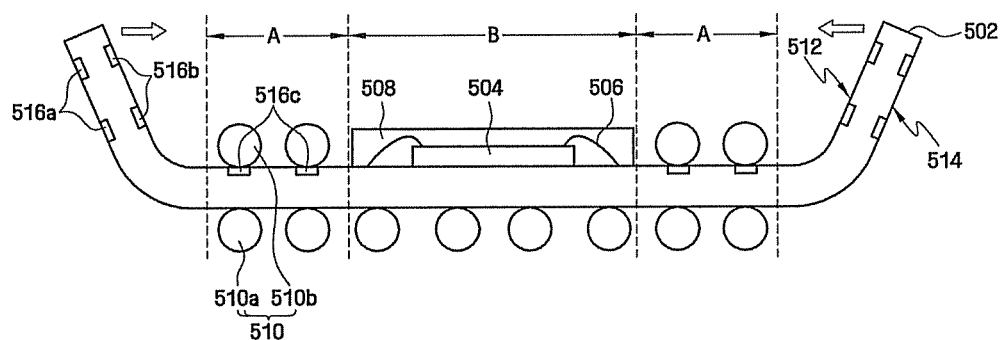

Referring to FIGS. 12 and 5, by bending portions of the substrate 502 arranged in the outer regions A' toward the upper surface 512 of the substrate 502 in the edge regions A, the second connection pads 516b arranged on the upper surface 512 of the substrate 502 in the outer regions A' may come into contact with the second solder balls 510b and the second connection pads 516b may become attached to the second solder balls 510b by performing a heat treatment process, for example, IR reflow. Accordingly, the substrate 502 in the edge regions A is deformed in a "C-shape" (, for example, "⊂" shape or in "⊃" shape), and the first connection pads 516a arranged on the lower surface 514 of the substrate 502 in the outer regions A' are in a direction in which the upper semiconductor package 400 may be laminated in the edge regions A.

In example embodiments, the upper semiconductor package 400 of FIG. 4 and the lower semiconductor package 500 of FIG. 5 may be formed by the above-described processes. Referring to FIG. 6, the upper semiconductor package 400 may be arranged on the upper portion of the lower semiconductor package 500 to make the solder balls 410 of the upper semiconductor package 400 contact the first connection pads 516a of the lower semiconductor package 500, and the solder balls 410 may become attached to the first connection pads 516a by performing a heat treatment process such as IR reflow, so that the upper semiconductor package 400 is laminated on the upper portion of the lower semiconductor package 500.

The package on package (POP) structure as described above is a structure in which two semiconductor packages may be laminated in layers. However, example embodiments are not limited thereto, and can be applied to a structure in which three or more semiconductor packages are laminated in layers in the same manner. For example, the uppermost semiconductor package among the plurality of packages vertically laminated may have the structure substantially the same as that as described above with reference to FIG. 4, and other semiconductor packages may have the structure substantially the same as those as described above with reference to FIG. 5. This structure is illustrated in FIG. 13.

Figure 13:
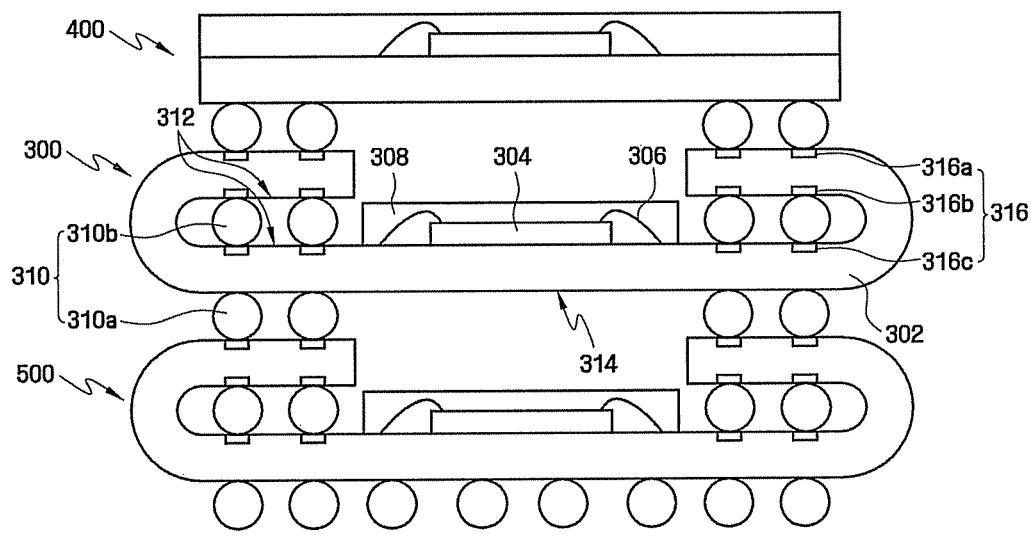
FIG. 13 is a sectional view of a package on package structure according to example embodiments.

FIG. 13 is a sectional view of a package on package structure according to example embodiments.

Referring to FIG. 13, an intermediate semiconductor package 300 may be interposed between the upper semiconductor package 400 as illustrated in FIG. 4 and the lower semiconductor package 500 as illustrated in FIG. 5 to form a three-layer package on package (POP) structure.

In example embodiments, the intermediate semiconductor package 300 may have a structure substantially the same as that of the lower semiconductor package 500.

In other words, the intermediate semiconductor package 300 may include a substrate 302, which has edge regions bent in a direction of an upper surface 312 so that edge regions A thereof are C-shaped (e.g., in " ⊂ " shape and in " ⊃ " shape) and a center region B thereof is in relatively flat shape (e.g., in a "—" shape). In example embodiments, a semiconductor chip 304, which may be attached to the upper surface 312 of the substrate 302 in the center region B, may be is electrically connected to the substrate 302 by wires 306. In example embodiments, an encapsulant 308 may be arranged on the upper surface 312 of the substrate 302 to seal the semiconductor chip 304 and the wires 306. In example embodiments, solder balls 310, and a plurality of connection pads 316 may be formed on upper and lower surfaces 312 and 314 of the substrate 302.

In example embodiments, the solder balls 310 may include first solder balls 310a attached to the lower surface 314 of the substrate 302 and the first solder balls 310a may be connected to corresponding first connection pads 516a of the lower semiconductor package 500. The solder balls 310 may also include second solder balls 310b interposed in a space between the facing portions of the upper surface 312 of the substrate 302 in the edge regions A. In example embodiments, the second solder balls 310b may be arranged to correspond to the solder balls 410 of the upper semiconductor package 400.

The connection pads 316 may include first connection pads 316a, second connection pads 316b, and third connection pads 316c. In example embodiments, the first connection pads may be arranged on the lower surface 314 of the substrate 302 and may be connected to the solder balls 410 of the upper semiconductor package 400. In example embodiments, the second and third connection pads 316b and 316c may be arranged on the upper surface 312 of the substrate 302 and may be connected to top and bottom portions of the second solder balls 310b.

In example embodiments, it is exemplified that one intermediate semiconductor package 300 is interposed between the lower semiconductor package 500 and the upper semiconductor package 400. However, example embodiments are not limited thereto, and a multilayer semiconductor package having the same structure as the intermediate semiconductor package 300 may be further interposed between the lower semiconductor package 500 and the upper semiconductor package 400.

Figure 14:
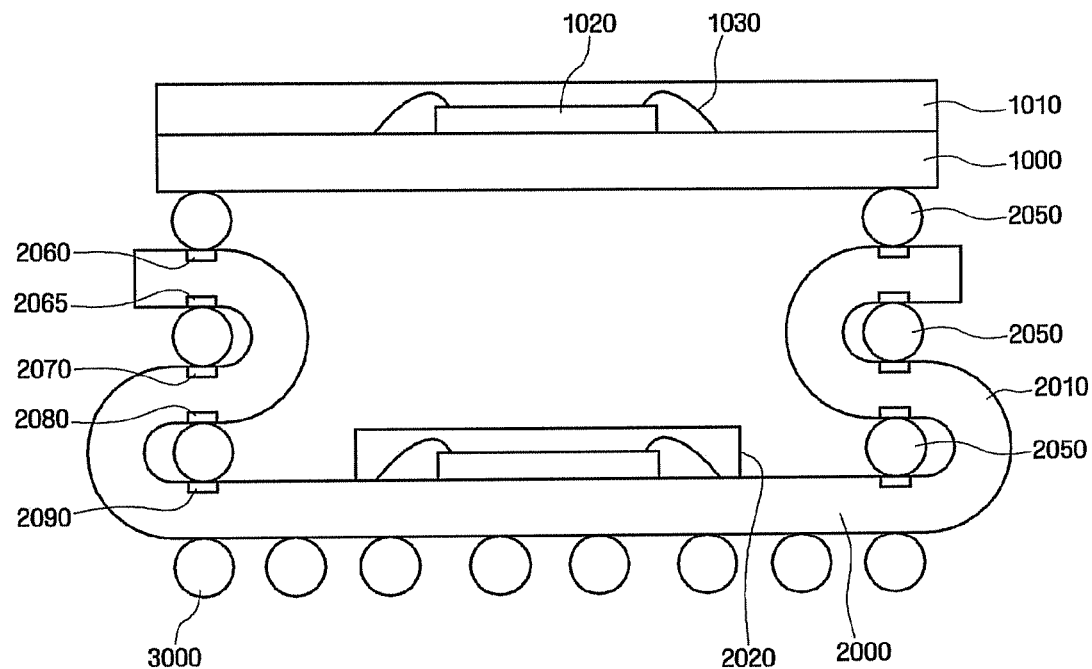
FIG. 14 is a sectional view of a package structure according to example embodiments.

Example embodiments are not limited to semiconductor packages having substrates including C-shaped edge regions as shown in, for example, FIG. 6. FIG. 14, for example, illustrates a semiconductor package structure including an upper package on a lower package. The upper package may include a substrate 1000, a semiconductor chip 1020, conductive wires 1030, and an encapsulant 1010 similar to the substrate 402, the semiconductor chip 404, conductive wires 406, and the encapsulant 408 illustrated in FIG. 6, therefore, for the sake of brevity these components will not be discussed. However, the lower semiconductor package of FIG. 14 includes S-shaped edge regions rather than the C-shaped edge regions as previously illustrated.

In greater detail, FIG. 14 illustrates a lower package having an encapsulant 2020 on an upper surface of a substrate 2000.

As shown in FIG. 14, the encapsulant 2020 may enclose and protect a semiconductor chip and wires. The wires enclosed by the encapsulant 2020 may connect the semiconductor chip enclosed by the encapsulant 2020 to the substrate 2000.

The substrate 2000 may be initially formed in a flat shape having an upper and lower surface. Connection pads may be formed on the upper and lower surfaces of the substrate 2000 and the connection pads may be arranged such that the connection pads faun a substantially straight vertical line when the end regions of the substrate 2000 are deformed into an "S-shape." For example, in FIG. 14, a first connection pad 2060, a fourth connection 2080 pad, and a fifth connection pad 2090 may be formed on an upper surface of the substrate 2000 and a second connection pad 2065 and a third connection pad 2070 may be formed on a lower surface of the substrate 2000. During fabrication, the edge regions of the substrate 2000 may be deformed into an "S-shape" to faun the S-shaped edge regions 2010. As shown in FIG. 14, the first connection pad 2060, the second connection pad 2065, the third connection pad 2070, the fourth connection pad 2080, and the fifth connection pad 2090 may be arranged in a relatively straight vertical line after the edge regions of the substrate 2000 have been deformed into the "S-shape."

In FIG. 14, solder balls 2050 may be formed to connect the substrate 2000 to the upper package and to connect the connection pads to one another. For example, a solder ball 2050 may connect the first connection pad 2060 to the substrate 1000. A solder ball 2050 may connect the second connection pad 2065 to the third connection pad 2070. A solder ball 2050 may also be used to connect the fourth connection pad 2080 to the fifth connection pad 2090. In addition to the solder balls 2050 connecting the substrate 2000 to the upper package and connecting the connection pads to one another, example embodiments also provide for a plurality of solder balls 3000 on a bottom surface of the substrate 2000. The solder balls 3000 may be configured to connect the substrate 2000 to an external device.

Although example embodiments have been described for illustrative purposes, those skilled in the art will appreciate that various modifications, additions and substitutions are possible, without departing from the scope and spirit of the invention as disclosed in the accompanying claims.

What is claimed is:

1. A package structure comprising:
   a first substrate having a first center region and a first C-shaped edge region at a first end of the first center region, the first C-shaped edge region forming a first space;
   at least two first connection pads on an inner surface of the first C-shaped edge region; and
   at least one first solder ball in the first space, the at least one first solder ball connected to the at least two first connection pads,
   wherein the at least two first connection pads connected by the at least one first solder ball face each other in the first space.

2. The package structure of claim 1, further comprising:
   at least one second connection pad on an outer surface of the first C-shaped edge region, the at least one second connection pad being arranged at an upper part of the first C-shaped edge region.

3. The package structure of claim 2, further comprising:
   at least one second solder ball on the outer surface of the first C-shaped edge region, the at least one second solder ball being arranged on a lower part of the first C-shaped edge region.

4. The package structure of claim 3, further comprising:
a first semiconductor chip on the first center region; and
wires connecting the first semiconductor chip to the first substrate.

5. The package structure of claim 4, further comprising:
a second C-shaped edge region at a second end of the first center region, the second C-shaped edge region forming a second space;
at least two third connection pads on an inner surface of the second C-shaped edge region, the at least two third connection pads arranged to face one another; and
at least one third solder ball in the second space, the at least one third solder ball connected to the at least two third connection pads.

6. The package structure of claim 5, further comprising:
at least one fourth connection pad on an outer surface of the second C-shaped edge region, the at least one fourth connection pad being arranged at an upper part of the second C-shaped edge region;
at least one fourth solder ball on the outer surface of the second C-shaped edge region, the at least one fourth solder ball being arranged on a lower part of the second C-shaped edge region.

7. The package structure of claim 1, further comprising:
a second substrate on the first substrate, the second substrate including a second center region above the first center region and a first edge region above the first C-shaped edge region;
a second semiconductor chip on the second center region; and
at least one fifth one solder ball on a lower surface of the second substrate.

8. The package structure of claim 7, wherein
the at least one fifth solder ball on the lower surface of the second substrate is on an outer surface of the first C-shaped edge region.

9. The package structure of claim 8, wherein the first substrate includes at least one second connection pad on the outer surface of the first C-shaped edge region, the at least one second connection pad being arranged at an upper part of the first C-shaped edge region, and the at least one fifth solder ball on the bottom surface of the second substrate is on the at least one second connection pad.

10. The package structure of claim 9, further comprising:
at least one second solder ball on the outer surface of the first C-shaped edge region, the at least one second solder ball being arranged on a lower part of the first C-shaped edge region.

11. The package structure of claim 10, further comprising:
a first semiconductor chip on the first center region; and
wires connecting the first semiconductor chip to the first substrate.

12. The package structure of claim 11, wherein
the first substrate further includes
a second C-shaped edge region at a second end of the first center region, the second C-shaped edge region forming a second space,
at least two third connection pads on an inner surface of the second C-shaped edge region, the at least two third connection pads arranged to face one another, and
at least one third solder ball in the second space, the at least one third solder ball connected to the at least two third connection pads; and
the second substrate further includes a second edge region on the second C-shaped edge region.

13. The package structure of claim 12, wherein
the first substrate includes
at least one fourth connection pad on an outer surface of the second C-shaped edge region, the at least one fourth connection pad being arranged at an upper part of the second C-shaped edge region, and
at least one sixth solder ball on the outer surface of the second C-shaped edge region, the at least one sixth solder ball connecting the second C-shaped edge section to the second edge region of the second substrate.

14. The package structure of claim 7, further comprising:
a third substrate on the first substrate, the third substrate having a third center region and a third C-shaped edge region at a first end of the third center region, the third C-shaped edge region forming a third space;
at least two fifth connection pads on an inner surface of the third C-shaped edge region, the at least two fifth connection pads arranged to face one another; and
at least one seventh solder ball in the third space, the at least one seventh solder ball connected to the at least two fifth connection pads.

15. The package structure of claim 14, further comprising:
at least one second connection pad on an outer surface of the first C-shaped edge region, the at least one second connection pad being arranged at an upper part of the first C-shaped edge region;
at least one second solder ball on the outer surface of the first C-shaped edge region, the at least one second solder ball being arranged on a lower part of the first C-shaped edge region; and
at least one seventh connection pad on an outer surface of the third C-shaped edge region, the at least one seventh connection pad being arranged at an upper part of the third C-shaped edge region and connected to the at least one second solder ball, wherein the at least one fifth solder ball on the lower surface of the second substrate is on an outer surface of the first C-shaped edge region.

16. The package structure of claim 15, wherein the at least one fifth solder ball on the bottom surface of the second substrate is on the at least one second connection pad.

17. The package structure of claim 16, wherein the at least one second solder ball is connected to the at least one seventh connection pad.

18. The package structure of claim 17, further comprising:
a first semiconductor chip on the first center region;
first wires connecting the first semiconductor chip to the first substrate;
a third semiconductor chip on the third center region; and
third wires connecting the third semiconductor chip to the third substrate.

19. The package structure of claim 18, wherein
the first substrate further includes
a second C-shaped edge region at a second end of the first center region, the second C-shaped edge region forming a second space,
at least two third connection pads on an inner surface of the second C-shaped edge region, the at least two third connection pads arranged to face one another, and
at least one third solder ball in the second space, the at least one third solder ball connected to the at least two third connection pads;
the second substrate further includes a second edge region on the second C-shaped edge region; and
the third substrate further includes
a fourth C-shaped edge region on the second C-shaped edge region, the fourth C-shaped edge region forming a fourth space, at least two eighth connection pads on an inner surface of the fourth C-shaped edge region, the at least two eighth connection pads arranged to face one another, and at least one eighth solder ball in the third space, the at least one eight solder ball connected to the at least two eighth connection pads.

20. The package structure of claim 19, wherein
the first substrate includes
   at least one fourth connection pad on an outer surface of the second C-shaped edge region, the at least one fourth connection pad being arranged at an upper part of the second C-shaped edge region,
   at least one sixth solder ball on the outer surface of the second C-shaped edge region, the at least one sixth solder ball connecting the second C-shaped edge section to the second edge region of the second substrate; and
the third substrate includes
   a ninth connection pad on an outer surface of the fourth C-shaped edge region, and a fourth solder ball connecting the ninth connection pad the second C-shaped edge section.

\* \* \* \* \*